(12) United States Patent
Huang

(10) Patent No.: US 8,026,529 B2
(45) Date of Patent: Sep. 27, 2011

(54) LIGHT-EMITTING DIODE LIGHT SOURCE MODULE

(75) Inventor: Shan-Fu Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 278 days.

(21) Appl. No.: 12/475,574

(22) Filed: May 31, 2009

(65) Prior Publication Data

US 2009/0302341 A1    Dec. 10, 2009

(30) Foreign Application Priority Data

Jun. 6, 2008  (CN) .......................... 2008 1 0302047

(51) Int. Cl.
*H01L 33/00* (2010.01)
(52) U.S. Cl. ..................... 257/98; 257/99; 257/E33.073
(58) Field of Classification Search .................. 257/98, 257/99, E33.073; 362/335, 336, 800
See application file for complete search history.

(56) References Cited

U.S. PATENT DOCUMENTS

| 7,461,960 B2* | 12/2008 | Opolka et al. ............... 362/545 |
| 2006/0076568 A1* | 4/2006 | Keller et al. ................... 257/98 |
| 2007/0086204 A1* | 4/2007 | Chinniah et al. ............ 362/520 |

* cited by examiner

*Primary Examiner* — Minh-Loan T Tran
(74) *Attorney, Agent, or Firm* — Altis Law Group, Inc.

(57) ABSTRACT

A light-emitting diode light source module includes a light-emitting diode and an optical lens which faces the light-emitting diode. The optical lens includes a light-emitting surface, a light-extracting surface opposite to the light-emitting surface, and a side surface interconnecting the light-emitting surface and the light-extracting surface. The light-emitting surface includes a first light-emitting portion and a second light-emitting portion. The light-extracting surface includes a first light-extracting portion and a second light-extracting portion surrounding the first light-extracting portion. An angle between the first light-emitting portion and the second light-emitting portion is an obtuse angle. An angle between the second light-emitting portion and the side surface is an acute angle. An angle between the side surface and second light-extracting portion is an acute angle.

10 Claims, 2 Drawing Sheets

LIGHT-EMITTING DIODE LIGHT SOURCE MODULE

BACKGROUND

1. Technical Field

The present disclosure relates to light source modules, and particularly to a light-emitting diode light source module.

2. Description of Related Art

A light-emitting diode (LED) is an electronic light source and is usually small in area with integrated optical components to shape its radiation pattern and assist in reflection. Light-emitting range of the light-emitting diode is usually between 90° and 120°. The brightness of the center of the light-emitting diode is higher than the surroundings and the light-emitting range of the center of the light-emitting diode is between 0° and 30°. Brightness of the light source is not uniform.

DETAILED DESCRIPTION

Figure 1:
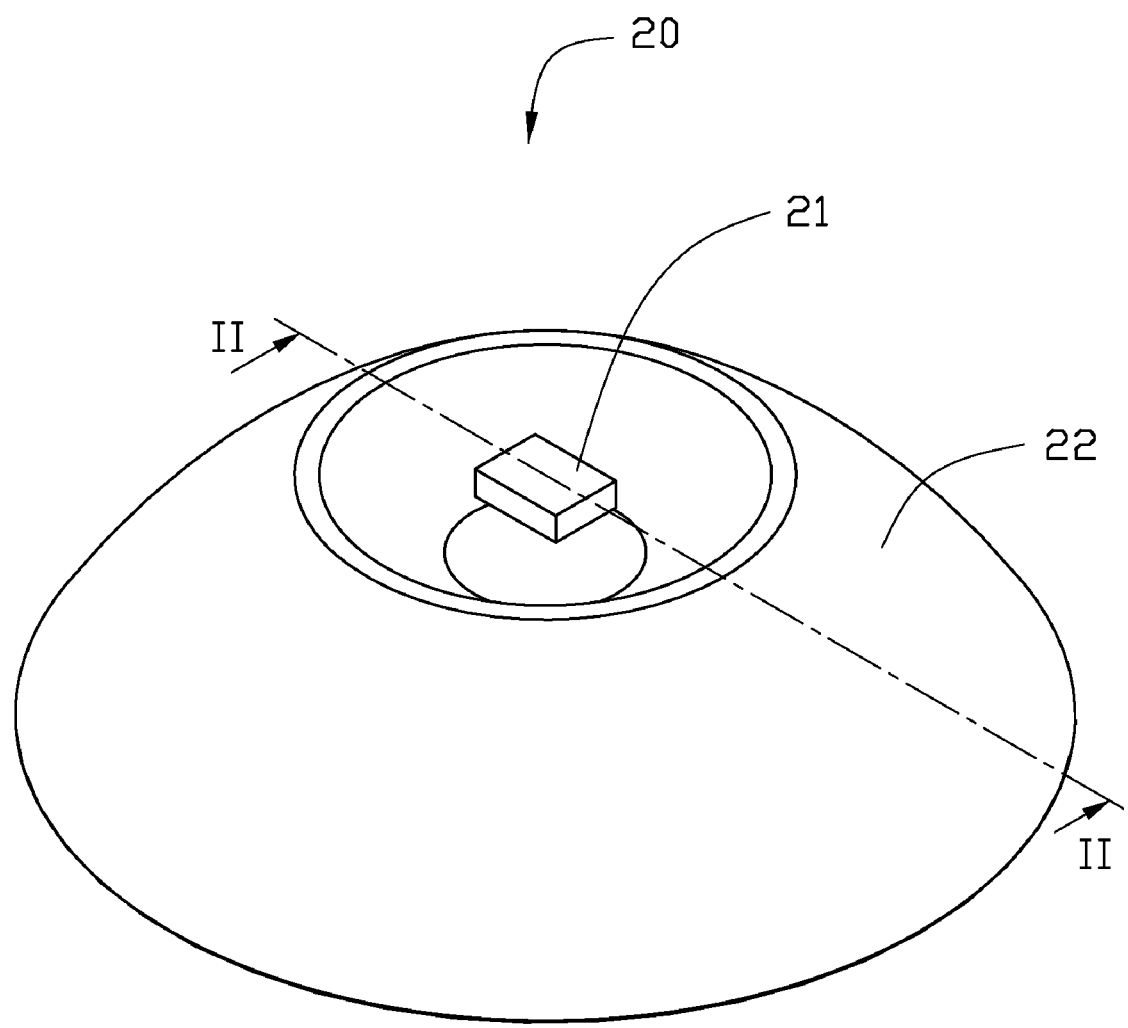
FIG. 1 is a perspective view of one embodiment of a light-emitting diode light source module.

Referring to FIG. 1, one embodiment of a light-emitting diode light source module 20 includes a light-emitting diode 21 and an optical lens 22 which faces the light-emitting diode 21.

Figure 2:
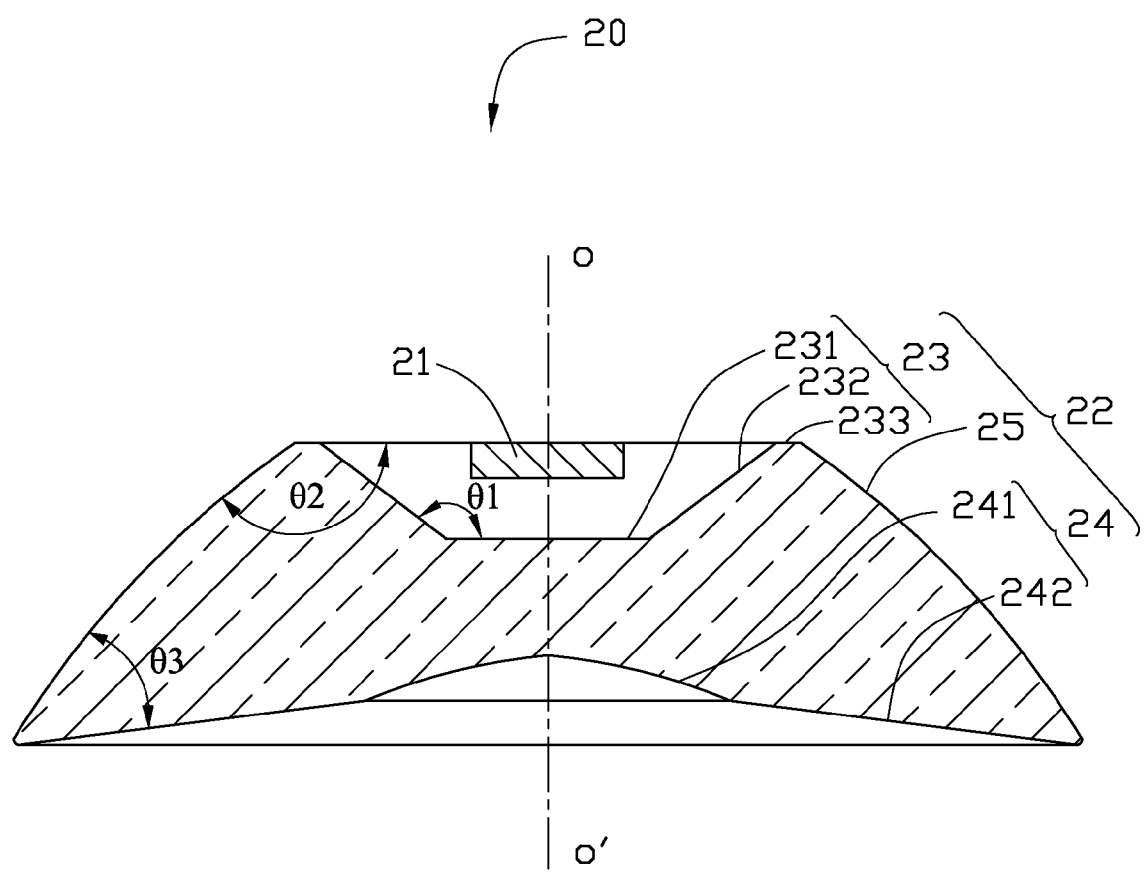
FIG. 2 is a cross section taken along plane II-II of the light-emitting diode light source module in FIG. 1.

Referring to FIG. 2, the optical lens 22 includes a light-emitting surface 23, a light-extracting surface 24 on the opposite side and a side surface 25 interconnecting the light-emitting surface 23 and the light-extracting surface 24.

The light-emitting surface 23 includes a first light-emitting portion 231, a second light-emitting portion 232 and a circular surface 233. The first light-emitting portion 231 comprises a substantially flat surface. The second light-emitting portion 232 interconnects first light-emitting portion 231 and the circular surface 233. The second light-emitting portion 232 surrounds the first light-emitting portion 231. An included angle θ1 between the first light-emitting portion 231 and the second light-emitting portion 232 is obtuse angle ranging between 110° and 160°, in one example. The circular surface 233 surrounds the second light-emitting portion 232. The circular surface 233 is substantially parallel to the first light-emitting portion 231. The circular surface 233 is configured for connecting other objects such as a camera module.

It should be noted that the light-emitting surface 23 may only include a first light-emitting portion 231 and a second light-emitting portion 232. The side surface 25 is connected to the second light-emitting portion 232.

The light-extracting surface 24 includes a first light-extracting portion 241 and a second light-extracting portion 242. The first light-extracting portion 241 corresponds to the first light-emitting portion 231. The first light-extracting portion 241 is a concave surface. The second light-extracting portion 242 surrounds the first light-extracting portion 241. The second light-extracting portion 242 is a circular concave surface.

The side surface 25 interconnects the circular surface 233 of the light-emitting surface 23 and second light-extracting portion 242 of the light-extracting surface 24. An included angle θ2 between the side surface 25 and the circular surface 233 is an obtuse angle ranging between 100° to 160°, in one example. An included angle θ3 between the side surface 25 and the second light-extracting portion 242 is an acute angle between 30° and 80°, in one example.

The optical lens 22 has an optical axis OO'. The light-emitting diode 21 is disposed on the optical axis OO' of the optical lens 22 and corresponds to the light-emitting surface 23.

The light-emitting diode 21 emits light to the optical lens 22. Some light emitted from the center of the light-emitting diode 21 enters the optical lens 22 and is refracted from the first light-extracting portion 241. The first light-extracting portion 241 is configured to reduce the brightness of the center of the light-emitting diode 21.

Light emitted from the periphery of the light-emitting diode 21 enters the second light-emitting portion 232, travels to the side surface 25 of the optical lens 22 and is totally refracted from the second light-extracting portion 242. The second light-extracting portion 242 is configured to increase the brightness of the periphery of the light-emitting diode 21. Thus, the light uniformity of the light source module 20 is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode light source module, comprising:
a light-emitting diode;
an optical lens facing the light-emitting diode, the optical lens comprising a light-emitting surface, a light-extracting surface on the opposite to the light-emitting surface, and a side surface interconnecting the light-emitting surface and the light-extracting surface, the light-emitting surface comprising a first light-emitting portion and a second light-emitting portion, the first light-emitting portion comprising a substantially flat surface, the light-extracting surface comprising a first light-extracting portion and a second light-extracting portion surrounding the first light-extracting portion, the first light-extracting portion comprising a concave surface, and the side surface comprising a total refraction surface;
wherein an angle between the first light-emitting portion and the second light-emitting portion is an obtuse angle, an angle between the second light-emitting portion and the side surface is an acute angle, and an angle between the side surface and second light-extracting portion is an acute angle.

2. The light-emitting diode light source module of claim 1, wherein the light-emitting surface comprises a circular surface surrounding the second light-emitting portion.

3. The light-emitting diode light source module of claim 2, wherein the circular surface is substantially parallel to the first light-emitting portion.

4. The light-emitting diode light source module of claim 2, wherein an included angle between the circular surface and the side surface is an obtuse angle.

5. The light-emitting diode light source module of claim 2, wherein the included angle ranging is between 100° and 160°.

6. The light-emitting diode light source module of claim 1, wherein the first light-extracting portion comprises a concave surface.

7. The light-emitting diode light source module of claim 1, wherein the second light-extracting portion comprises a circular concave surface.

8. The light-emitting diode light source module of claim 1, wherein the included angle ranging between the first light-emitting portion and the second light-emitting portion is between 110° and 160°.

9. The light-emitting diode light source module of claim 1, wherein the included angle ranging between the side surface and second light-extracting portion is between 30° and 80°.

10. The light-emitting diode light source module of claim 1, wherein the optical lens comprises an optical axis, on which the light-emitting diode is positioned.

* * * * *